United States Patent
Nishimura

(10) Patent No.: US 6,989,522 B2
(45) Date of Patent: Jan. 24, 2006

(54) LIGHT-RECEIVING MODULE AND LIGHT-RECEIVING DEVICE HAVING MALFUNCTION PREVENTING STRUCTURE

(75) Inventor: Susumu Nishimura, Tottori (JP)

(73) Assignees: Sanyo Electric Co., Ltd., Osaka (JP); Tottori Sanyo Electric Co., Ltd., Tottori (JP)

( * ) Notice: Subject to any disclaimer, the term of this patent is extended or adjusted under 35 U.S.C. 154(b) by 230 days.

(21) Appl. No.: 10/332,540

(22) PCT Filed: Jul. 6, 2001

(86) PCT No.: PCT/JP01/05923

§ 371 (c)(1),
(2), (4) Date: Jan. 10, 2003

(87) PCT Pub. No.: WO02/05355

PCT Pub. Date: Jan. 17, 2002

(65) Prior Publication Data

US 2003/0141437 A1    Jul. 31, 2003

(30) Foreign Application Priority Data

Jul. 11, 2000   (JP) ............................ 2000-210191

(51) Int. Cl.
H01L 31/00 (2006.01)
(52) U.S. Cl. .................................... 250/214.1; 257/458
(58) Field of Classification Search ............. 250/214.1, 250/208.1; 257/458–465, 294, 435
See application file for complete search history.

(56) References Cited

U.S. PATENT DOCUMENTS

| 4,831,430 A | * | 5/1989 | Umeji | 257/463 |
| 5,124,772 A | * | 6/1992 | Hideshima et al. | 257/110 |
| 6,160,253 A | * | 12/2000 | Oimura et al. | 250/214.1 |
| 6,259,085 B1 | * | 7/2001 | Holland | 250/208.1 |
| 6,380,602 B1 | * | 4/2002 | Fujisawa et al. | 257/463 |

FOREIGN PATENT DOCUMENTS

| JP | 61-029180 A1 | 2/1986 |
| JP | 64-001286 A1 | 1/1989 |
| JP | 64-024472 A1 | 1/1989 |
| JP | 05-013798 A1 | 1/1993 |
| JP | 05-343727 A1 | 12/1993 |

OTHER PUBLICATIONS

A copy of International Preliminary Examination Report mailed on Oct. 1, 2001 (Japanese).
A copy of English translation of International Search Report mailed on Aug. 14, 2001.
A copy of International Search Report mailed on Aug. 14, 2001 (Japanese).

* cited by examiner

Primary Examiner—Thanh X. Luu
(74) Attorney, Agent, or Firm—McDermott Will & Emery LLP

(57) ABSTRACT

A light-receiving device has a high-concentration impurity layer of a first conductivity type and a high-concentration impurity layer of a second conductivity type surrounding it formed on a substrate of the first conductivity type having a low impurity concentration so as to function as a light-receiving portion. The high-concentration impurity layers of the first and second conductivity types are arranged in the same direction as the top surface of the substrate. A layer having a short carrier life time is formed on the bottom surface of the substrate. Thus, carriers ascribable to unnecessary light components that have reached the layer having a short carrier life time have a shorter life time, making it possible to sufficiently cut unnecessary long-wavelength light components.

9 Claims, 5 Drawing Sheets

LIGHT-RECEIVING MODULE AND LIGHT-RECEIVING DEVICE HAVING MALFUNCTION PREVENTING STRUCTURE

TECHNICAL FIELD

The present invention relates to a light-receiving device and to a light-receiving module incorporating it.

BACKGROUND ART

A light-receiving device incorporated in a light-receiving module for remote control applications is generally composed of a light-receiving device for infrared light. Conventionally known examples of such light-receiving devices are those having a light-receiving portion composed of a PIN-type diode formed in the thickness direction of a substrate as shown in FIG. 9 or along the surface of a substrate as shown in FIG. 10. In FIG. 9, reference numeral 101 represents a P-layer, reference numeral 102 represents a P+ layer, reference numeral 103 represents an N+ layer, reference numeral 104 represents an insulating layer of $SiO_2$, reference numeral 105 represents an N electrode, and reference numeral 106 represents a P electrode. The structure shown in FIG. 9 has the disadvantage that carriers 107 ascribable to long-wavelength light components that have reached the P+ layer 102 diffuse (indicated by arrow Lp) and produce a photoelectric current. On the other hand, in FIG. 10, reference numeral 201 represents a depletion layer (of which the thickness is represented by W), reference numeral 202 represents a P+ layer, reference numeral 203 represents an N+ layer formed in the shape of a ring, reference numeral 204 represents an insulating layer of $SiO_2$, reference numeral 205 represents a P electrode, and reference numeral 206 represents an N electrode. The structure shown in FIG. 10 has the disadvantage that even carriers 207 ascribable to long-wavelength light components which appear outside the depletion layer 201 produce a photoelectric current within the diffusion length (Lp) of the carriers 207. In this way, in conventional light-receiving devices, reception of light having longer wavelengths than the desired wavelengths may cause a malfunction.

Light-receiving devices like this are usually used in a form covered with a visible light shielding resin to prevent malfunctions due to visible light. Moreover, such light-receiving devices are extremely susceptible to electromagnetic noise, and this also leads to malfunctions in light-receiving modules incorporating them. To prevent this, a conductive film (metallized film) or the like is inserted in a light-receiving module, or a mesh-like structure is arranged in the light-receiving window of a module case. On the other hand, in a light-receiving module sealed with a resin instead of being furnished with a metal case, a mesh-like metal conductive member is formed on the surface of a light-receiving device incorporated therein.

In illumination apparatus employing an infrared light-receiving module, the effects of visible light are coped with by the use of a light-receiving module or light-receiving device covered with a visible light shielding resin. In reality, however, illumination apparatus are fitted with a band-path filter or the like to alleviate the effects of light from a fluorescent lamp which contains light components at many wavelengths spread across its spectrum. Moreover, in recent years, as it becomes increasingly common to use a plurality of fluorescent lamps together or to use fluorescent lamps with increasingly high outputs, more attention than ever has come to be paid to malfunctions of light-receiving modules ascribable to light components at particular wavelengths (for example, at 1,013 nm) within the spectrum of the light from a fluorescent lamp. For these reasons, light-receiving modules in practical use either have an interference filter arranged on top of a light-receiving device covered with a visible light shielding resin so as to receive signals cleared of unwanted light components having particular wavelengths within the spectrum of the light present, or have an interference filter embedded in a visible light shielding resin.

This increases the number of components and the number of assembly steps required to fabricate light-receiving modules, and thus increases their costs. Moreover, in a case where an interference filter is embedded in a resin, it is difficult to achieve satisfactory reliability in terms of the accuracy with which the interference filter is fitted, exfoliation of the resin from the interference filter, and other factors.

Moreover, in a light-receiving module sealed in a resin, a mesh-like metal conductive member is formed on an internal light-receiving surface, and forming such a conductive member directly on the surface of a light-receiving device is equivalent to forming a parallel-plate capacitor there. This increases the capacitance of the device, and thus shortens the distance over which the light-receiving module incorporating it can receive signals.

DISCLOSURE OF THE INVENTION

An object of the present invention is to provide a light-receiving device and a light-receiving module that do not malfunction even when they receive light having longer wavelengths than the desired wavelengths. Another object of the present invention is to provide a light-receiving device and a light-receiving module that do not malfunction even when they receive light having wavelengths other than those desired or the like, without an increase in the capacitance of the device. Another object of the present invention is to provide a light-receiving module that does not malfunction in response to unwanted light having particular wavelengths or the like, without requiring a band-path filter, an interference filter, or a mesh-like structure in a light-receiving window.

To achieve the above objects, according to the present invention, in a light-receiving device having a high-concentration impurity layer of a first conductivity type and a high-concentration impurity layer of a second conductivity type formed on a substrate having a low impurity concentration so as to function as a light-receiving portion, with the high-concentration impurity layers of the first and second conductivity types arranged in the same direction as the top surface of the substrate, a layer having a short carrier life time is formed on the bottom surface of the substrate. The layer having a short carrier life time may be a high-concentration impurity layer of the first or second conductivity type. Alternatively, the layer having a short carrier life time may be a layer formed by adding to the substrate an impurity such as gold that forms a deep level. One of the high-concentration impurity layers of the first and second conductivity types may be shielded with an electrode that is kept at the identical potential with the other of the high-concentration impurity layers of the first and second conductivity types. According to the present invention, a light-receiving module is fabricated by fixing a light-receiving device as described above on a lead frame with an insulating material.

Alternatively, according to the present invention, a light-receiving module is composed of a lead frame, a light-receiving device fixed on the lead frame, and an insulating resin in which the lead frame and the light-receiving device are integrally sealed. Here, the light-receiving device is composed of: a substrate having a low impurity concentration; a layer having a short carrier life time formed on the bottom surface of the substrate; a high-concentration impurity layer of a first conductivity type formed on the top-surface side of the substrate so as to have a predetermined thickness; a high-concentration impurity layer of a second conductivity type formed on the top-surface side of the substrate so as to surround the high-concentration impurity layer of the first conductivity type, the high-concentration impurity layers of the first and second conductivity types together functioning as a light-receiving portion; an insulating layer formed on the top surface of the substrate; and an electrode formed on the insulating layer and kept at the identical potential with the high-concentration impurity layer of the first conductivity type so as to shield the high-concentration layer of the second conductivity type. Moreover, the layer having a short carrier life time is fixed on the lead frame with an insulating material.

BEST MODE FOR CARRYING OUT THE INVENTION

Figure 1:
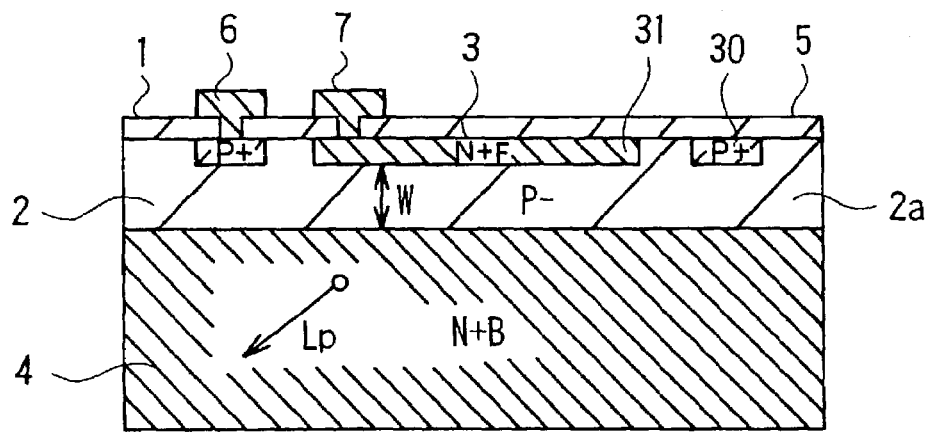
FIG. 1 is a sectional view showing a light-receiving device embodying the invention.
Figure 2:
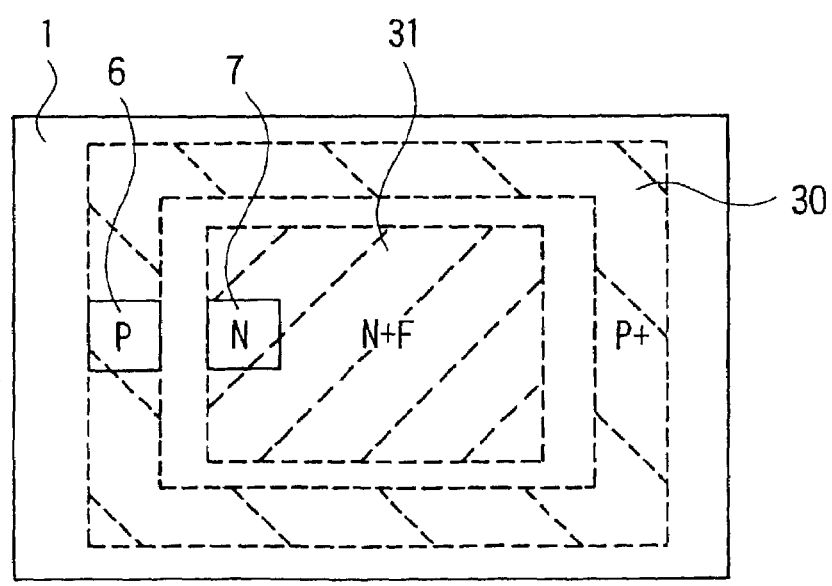
FIG. 2 is a plan view of the light-receiving device of FIG. 1.

Hereinafter, embodiments of the present invention will be described with reference to the drawings. FIG. 1 is a sectional view showing the light-receiving device of a first embodiment of the invention, and FIG. 2 is a plan view thereof. The light-receiving device 1 has a light-receiving portion 3 formed on the top surface of a substrate 2 having a low impurity concentration, and has a layer 4 having a short carrier life time formed on the bottom surface of the substrate 2.

The substrate 2 is formed out of, for example, a Si substrate of a first conductivity type (P-type) having a device impurity concentration of $4 \times 10^{13}$ cm$^{-3}$ or lower and a thickness of about 300 μm. This substrate 2 is so prepared as to have a high resistance, for example a specific resistance of 500 Ωcm or higher, and functions as a (P−) layer 2a. In the bottom surface of the substrate 2, an N-type impurity such as phosphorus (P) is diffused to form a high-concentration impurity layer 4 of a second conductivity type (N-type) that functions as the layer having a short carrier life time and that has a depth (thickness) of about 150 μm. In the figure, for convenience sake, this high-concentration impurity layer 4 of the second conductivity type is marked (N+B). The N-type high-concentration impurity layer 4 is so prepared as to have (when formed out of a Si substrate) an impurity concentration higher than $1 \times 10^{16}$ cm$^{-3}$, at which the carrier life time starts shortening sharply as the impurity concentration is increased gradually when observed in a characteristic diagram (not shown) that shows the carrier life time, taken along the vertical axis, with respect to the impurity concentration, taken along the horizontal axis; for example, it is so prepared as to have an impurity concentration of about $3 \times 10^{18}$ cm$^{-3}$.

The light-receiving portion 3 is composed of a high-density impurity layer 30 of a first conductivity type and a high-concentration impurity layer 31 of a second conductivity type that are arranged in the same direction as the top surface of the substrate 2. In the figure, for convenience sake, the high-density impurity layer 30 of the first conductivity type is marked P+, and the high-density impurity layer 31 of the second conductivity type is marked (N+F). The high-density impurity layer 30 of the first conductivity type is formed by diffusing a P-type impurity such as boron (B) in the shape of a ring in the top surface of the substrate 2. This impurity layer 30 is so prepared as to have an impurity concentration of about $3 \times 10^{19}$ cm$^{-3}$ and a depth of about 3 μm. On the other hand, the high-density impurity layer 31 of the second conductivity type is formed by diffusing an N-type impurity such as phosphorus (P) in a region surrounded by the layer 30 in the top surface of the substrate 2. This layer 31 is so prepared as to have a sheet resistance of about 20 Ω/□ and a depth (thickness) of 1 to 2 μm.

On the surface of the substrate 2, a film 5 of, for example, silicon oxide (SiO$_2$) is formed that functions as a surface-protection and anti-reflection film. Parts of the film 5 are removed by photolithography to permit contact with the high-density impurity layers 30 and 31 of the first and second conductivity types. On the film 5, a metal such as aluminum is vapor-deposited and the unnecessary portion thereof is removed by photolithography to form a P-side and an N-side electrode 6 and 7.

Figure 9:
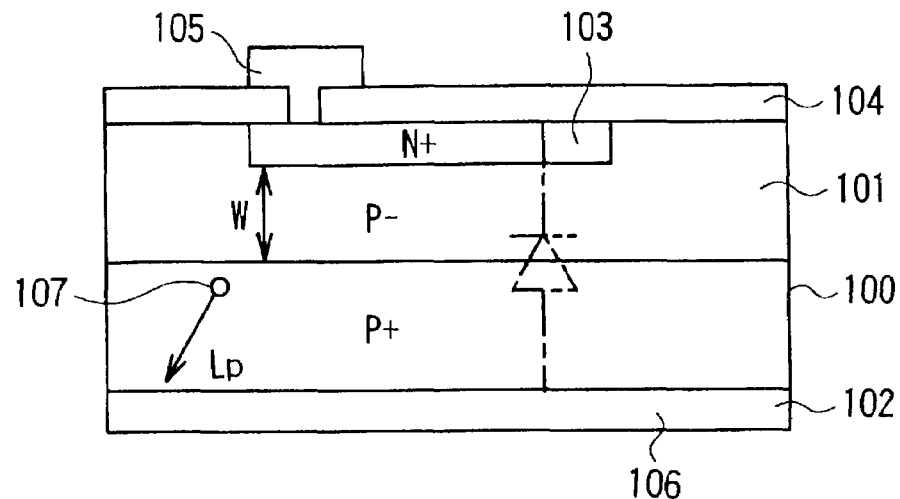
FIG. 9 is a schematic sectional view showing a conventional example.
Figure 10:
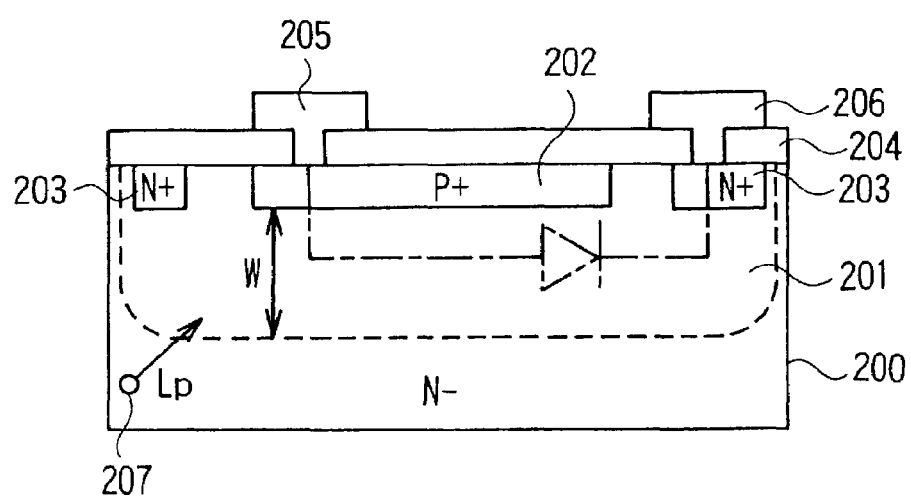
FIG. 10 is a schematic sectional view showing another conventional example.

Now, the operation of the light-receiving device of this embodiment will be described, with the focus placed on how it cuts long-wavelength light components. First, the quantum efficiency R with which the light incident on the light-receiving device 1 is converted into a photoelectric current in the depth direction is given by $R = 1 - \exp(-\alpha W)/(1 + \alpha L_p)$. Here, W represents the thickness of the low-concentration impurity region 2a (i.e., the thickness of the depletion layer that expands on application of a reverse voltage), α represents the optical absorption coefficient for light having a given wavelength, and $L_p$ represents the diffusion length of carriers in the high-concentration impurity layer 4 on the bottom surface. Accordingly, the efficiency R can be increased by giving the low-concentration impurity region 2a a sufficient thickness W, in other words, by restricting the thickness W for unwanted light components having particular wavelengths. However, in the light-receiving device shown in FIG. 9 and described earlier, even when the thickness W of the low-concentration region 101 is restricted, of the carriers generated in the high-concentration impurity layer 107, those ascribable to the diffusion length $L_p$ produce a photoelectric current, and this makes it impossible to sufficiently reduce long-wavelength light components. On the other hand, in the light-receiving portion formed on the top surface of the light-receiving device shown in FIG. 10, since an electric field is applied parallel to the top surface of the substrate, the expansion of the depletion layer 201, which is the region in which light can be received efficiently, in the depth direction can be reduced, but, of the carriers that are produced outside the depletion layer, those ascribable to the diffusion length Lp produce a photoelectric current, and this makes it impossible to sufficiently reduce long-wavelength light components.

By contrast, in the first embodiment of the invention, as shown in FIGS. 1 and 2, the high-concentration impurity layer 4 formed on the back surface of the low-concentration impurity region 2a serves to restrict the thickness of the latter to the thickness W calculated according to the formula noted above. This makes it possible to eliminate the carriers generated in the high-concentration impurity layer 4 quickly before they produce a photoelectric current. Here, the high-concentration impurity layer on the back surface is independent of the electrodes (P-side and N-side electrodes 6 and 7) on the top surface so as to be electrically insulated therefrom.

In this way, the high-concentration impurity layer 4 restricts the thickness W of the low-concentration impurity region 2a (depletion layer) to the optimum thickness, and in addition shortens the life time of the carriers generated by unnecessary light components that have reached the high-concentration impurity layer 4 (i.e., shortens Lp) so as to prevent their diffusion. Thus, it is possible to sufficiently cut unwanted light components (long-wavelength light components).

Figure 4:
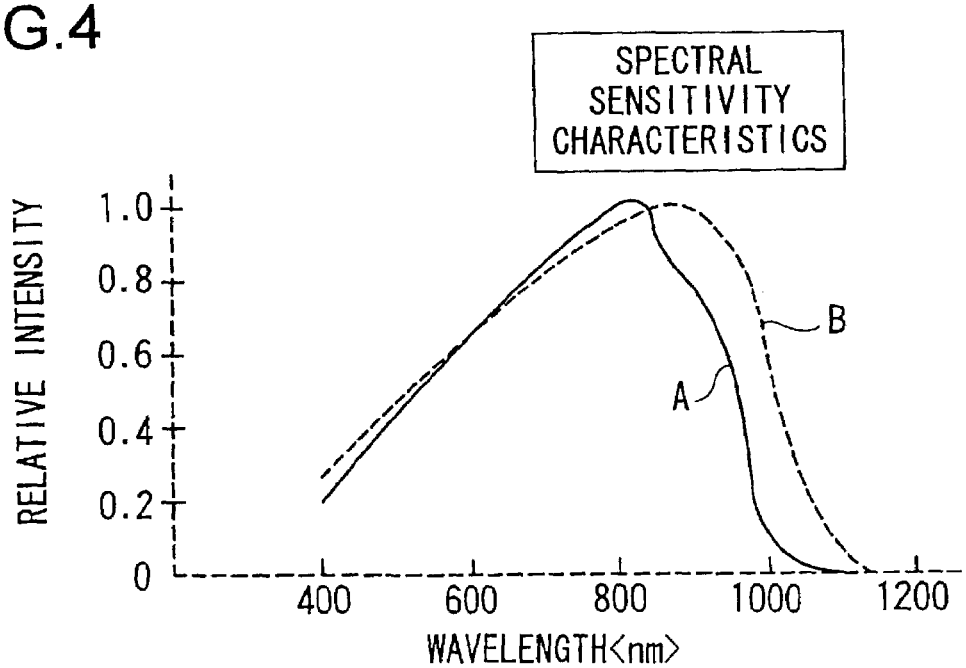
FIG. 4 is a diagram showing spectral sensitivity characteristics.

In this embodiment, to eliminate incident light having a wavelength of 1,000 nm, the P-type low-concentration impurity region 2a is given a thickness W of 90 $\mu$m. Here, the high-concentration impurity layer 4 on the back surface has a carrier diffusion length of 1 $\mu$m and an optical absorption coefficient of $7 \times 10^1$ cm$^{-1}$ for incident light having a wavelength of 1,000 nm. FIG. 4 shows the spectral sensitivity characteristic A of the light-receiving device shown in FIG. 1 and the spectral sensitivity characteristic B of the light-receiving device shown in FIG. 9. This figure shows that the light reception sensitivity for incident light having a wavelength of 1,000 nm here is reduced to about one sixth of that obtained conventionally.

Figure 3:
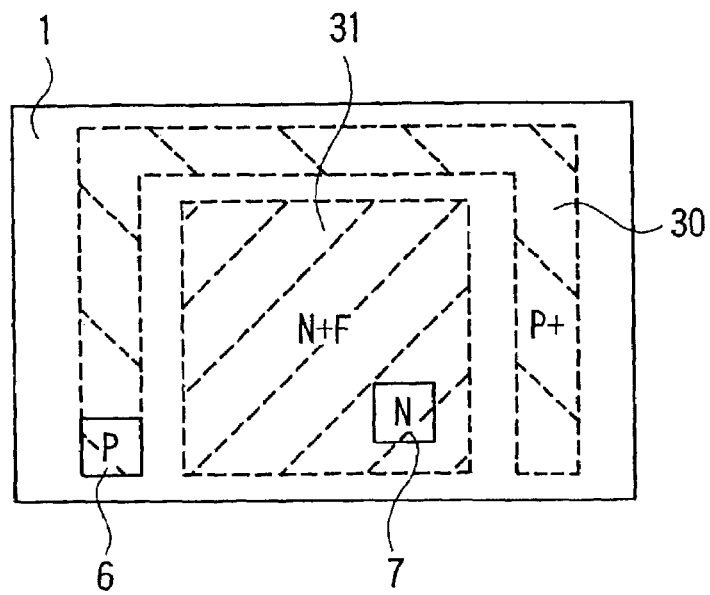
FIG. 3 is a plan view showing another light-receiving device embodying the invention.

FIG. 3 shows a modified embodiment of the light-receiving device 1. This light-receiving device has the same internal structure as the one shown in FIG. 1 and described above, but has a different surface shape therefrom. Specifically, here, the high-density impurity layer 30 as seen in a plan view is so shaped as to surround the high-density impurity layer 31 from three sides, instead of from four sides. Moreover, the P-side and N-side electrodes 6 and 7 are arranged in opposite parts of the light-receiving device, instead of side by side.

Figure 5:
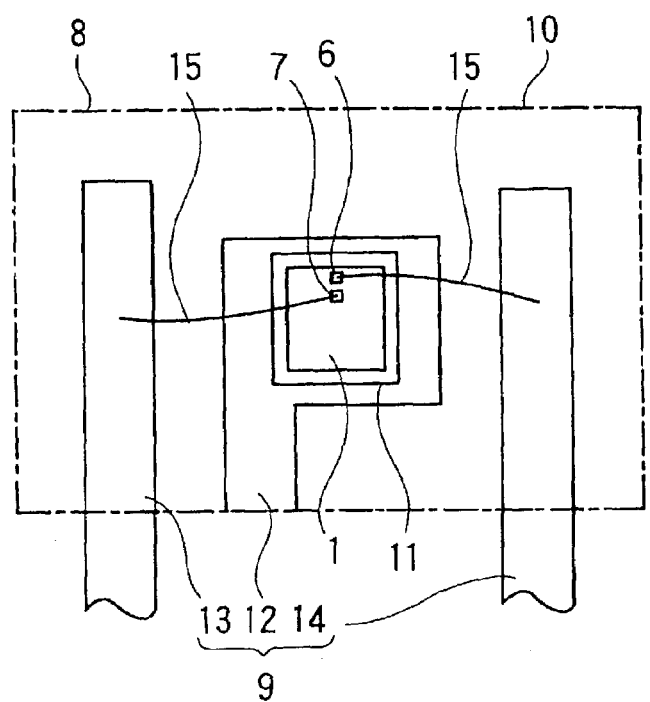
FIG. 5 is a plan view showing a light-receiving module embodying the invention.

FIG. 5 is a plan view of a principal portion of a light-receiving module 8 embodying the invention which incorporates the light-receiving device 1. This light-receiving module 8 has the light-receiving device 1 mounted on a metal lead frame 9, and has these integrally sealed in a molding of an insulating resin 10 containing an ingredient that shields visible light. Here, the light-receiving device 1 is mounted, with conductive adhesive, on a central lead frame portion 12, which is separated from other lead frame portions 13 and 14, so that the light-receiving device 1 is electrically insulated therefrom. Between the two side lead frame portions 13 and 14 and the P-side and N-side electrodes 6 and 7, gold wires 15a and 15b or the like are laid by wire bonding to permit extraction of a detection signal from the light-receiving device 1.

Figure 6:
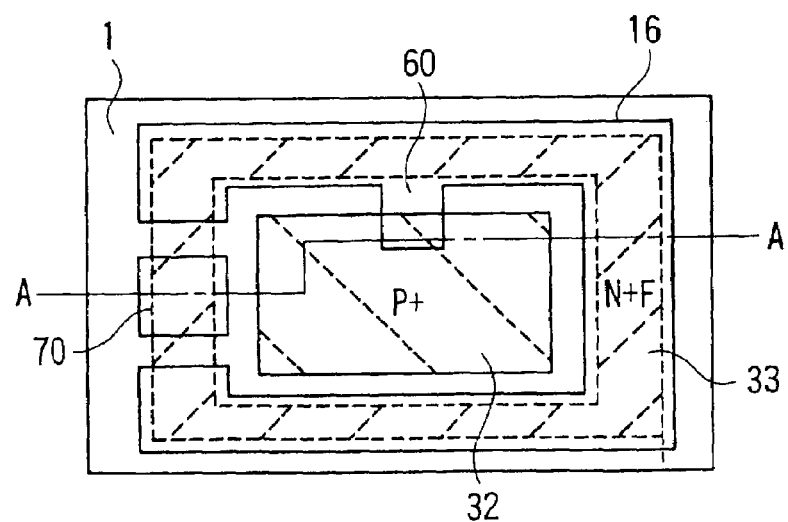
FIG. 6 is a plan view showing another light-receiving device embodying the invention.
Figure 7:
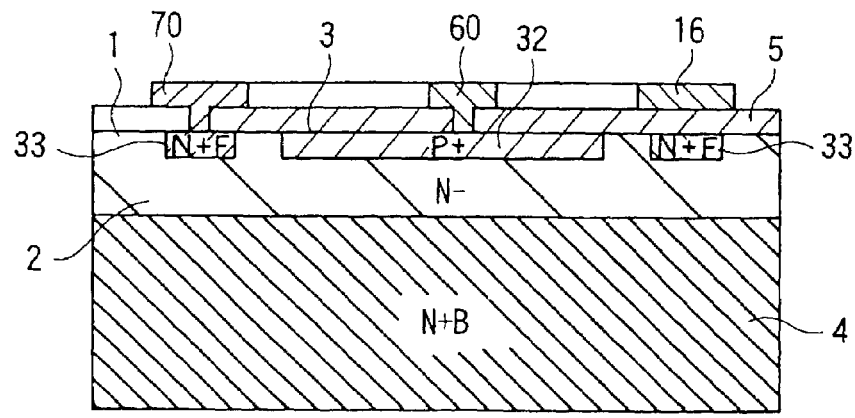
FIG. 7 is a sectional view of the light-receiving device of FIG. 6.

FIGS. 6 and 7 show still another embodiment of the light-receiving device 1, where an electromagnetic shield is provided on the light-receiving surface. FIG. 7 is a sectional view along line A—A shown in FIG. 6. This light-receiving device 1 has a structure similar to that of the light-receiving device shown in FIG. 1, but differs therefrom in that the conductivity types of the substrate 2 and the light-receiving portion 3 are completely opposite in terms of whether their materials are of an N- or P-type, that an electrode 16 for shielding is formed on the surface of the substrate 2, and other aspects. Specifically, the substrate 2 having a low impurity concentration is formed out of, for example, an N-type Si substrate having a device impurity concentration of $4 \times 10^{13}$ cm$^{-3}$ or lower and a thickness of about 300 $\mu$m. The layer 4 having a short carrier life time formed on the back surface of the substrate 2 is formed as a high-concentration impurity layer of the same conductivity type as the substrate 2, i.e., N-type. This N-type high-concentration impurity layer 4 is so prepared as to have, for example, an impurity concentration of about $3 \times 10^{18}$ cm$^{-3}$ and a depth (thickness) of 150 $\mu$m.

The light-receiving portion 3 is composed of a high-density impurity layer 32 of a first conductivity type and a high-concentration impurity layer 33 of a second conductivity type that are arranged in the same direction as the top surface of the substrate 2. In the figure, for convenience' sake, the high-density impurity layer 32 of the first conductivity type is marked P+, and the high-density impurity layer 33 of the second conductivity type is marked (N+F). The high-density impurity layer 32 of the first conductivity type is formed by diffusing a P-type impurity such as boron (B) in a central portion of the top surface of the substrate 2. This impurity layer 32 is so prepared as to have a sheet resistance of about 20 $\Omega/\square$ and a depth of 1 to 2 $\mu$m. On the other hand, the high-density impurity layer 33 of the second conductivity type is formed by diffusing an N-type impurity such as phosphorus in the top surface of the substrate 2 so as to surround the region in which the layer 30 is formed. This layer 31 is so prepared as to have an impurity concentration of about $3 \times 10^{19}$ cm$^{-3}$ and a depth (thickness) of about 3 $\mu$m.

On the surface of the substrate 2, an insulating film 5 of, for example, silicon oxide (SiO$_2$) is formed that functions as a surface-protection and anti-reflection film. Parts of the film 5 are removed by photolithography to permit contact with the high-density impurity layers 32 and 33 of the first and second conductivity types. On the film 5, a metal such as aluminum is vapor-deposited and the unnecessary portion thereof is removed by photolithography to form a P-side and an N-side electrode 60 and 70. The N-side electrode 70 formed on the insulating film 5 is so formed as to be wider than the layer 33. The P-side electrode 60 is formed in the shape of a ring so as to cover the layer 33 completely from above except in the region thereof where the N-side electrode 70 is formed, and thus forms the electrode 16 for shielding.

Figure 8:
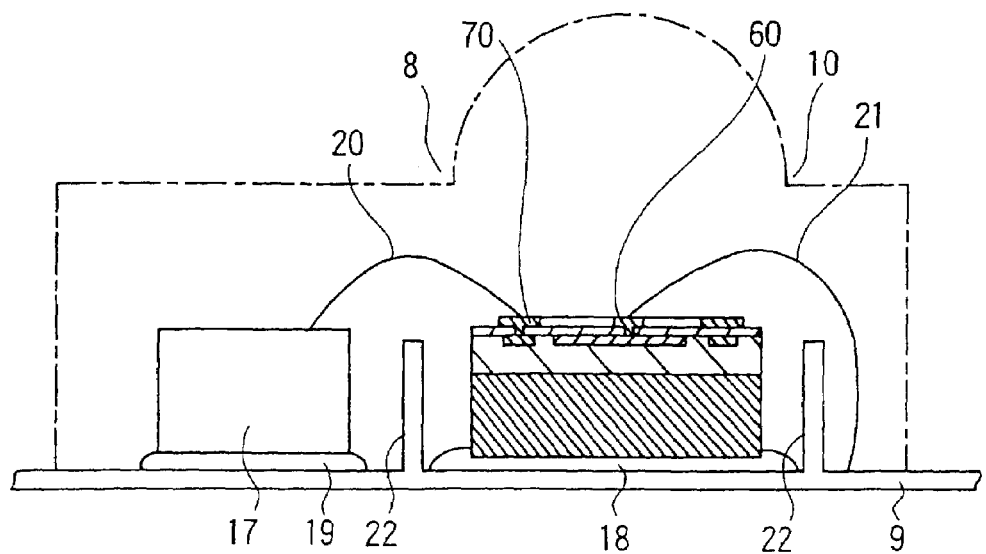
FIG. 8 is a schematic sectional view showing another light-receiving module embodying the invention.

FIG. 8 shows a light-receiving module 8 embodying the invention which incorporates the light-receiving device 1 shown in FIGS. 6 and 7. This light-receiving module 8 has the light-receiving device 1 and an IC 17 for driving it mounted on a common lead frame 9, and has these integrally sealed in a molding of a resin 10, forming a single-molding structure. The resin 10 used here is an insulating resin containing a material that shields visible light, but the molding may be formed out of a resin of another type.

In general, a monolithic structure having a light detector and a driver IC formed on a single chip suffers from insufficient light reception sensitivity of the light detector.

For this reason, this light-receiving module 8 adopts a two-chip structure that combines together a light-receiving device and a driver IC 17 that excel in high operating speed and high sensitivity. Specifically, on the lead frame 9, the light-receiving device 1 is fixed with insulating adhesive 18, and the IC 17 is fixed with conductive adhesive 19. Thus, the only additional connection needed between the light-receiving device 1 and the IC 17 is the wiring between the N-side electrode 70 of the former and an amplifier circuit portion of the latter with a gold wire 20 or the like. The P-side electrode 60 of the light-receiving device 1 is wired to the lead frame 9 with a gold wire 21 or the like so as to be connected to the ground potential.

As described above, by bonding the light-receiving device 1 on the common lead frame 9 with the insulating adhesive 18 and then connecting to the lead frame 9 with the wire 21 the electrode 60 that connects to the layer 32, which is the light-receiving surface formed on the top surface of the light-receiving device 1, it is possible to realize a structure in which the light-receiving device 1, which is susceptible to electromagnetic noise, is sandwiched between identical potentials from above and below, and thereby achieve effective electromagnetic shielding. Moreover, the surface of the layer 33 can also be shielded with the shielding electrode 16.

For more effective electromagnetic shielding, the light-receiving module shown in FIG. 8 is provided with a structure that permits the side surfaces of the light-receiving device 1 to be covered with a potential identical with that of the lead frame 9. Specifically, walls 22 having about the same height as the side surfaces of the light-receiving device 1 are formed integrally with the lead frame 9, and these walls 22 also are used for electromagnetic shielding. Alternatively, a portion of the lead frame 9 may be formed into a depressed portion so that the light-receiving device 1 is housed inside it. Even a single such wall 22 covering a side surface of the light-receiving device 1 contributes to electromagnetic shielding, but it is preferable to provide a plurality of such walls to cover more, further preferably all the four, side surfaces of the light-receiving device 1. These walls 22 are not absolutely necessary in structural terms, but are useful to achieve a greater shielding effect.

The embodiments described above deal with, as examples, light-receiving devices 1 of a PIN photodiode type. However, the present invention applies not only to light-receiving devices of this particular type but also to common photodiodes of a PN type and to light-receiving devices integrated in ICs formed on the same substrates as driver ICs.

The embodiments described above deal with examples in which an N-type high-concentration impurity layer is used as a layer 4 having a short carrier life time. However, it is also possible to use a P-type high-concentration impurity layer instead. A layer formed by adding to the substrate an impurity such as gold that forms a deep level also helps shorten the carrier life time, and therefore it is also possible to use such a layer as the layer 4. The embodiments described above offer the following advantages.

(1) It is possible to give the light-receiving device itself the function of a cut filter, i.e., that of reducing the sensitivity to long-wavelength light. Conventionally, illumination apparatus are fitted with a band-path filter or the like to alleviate the effects of light from a fluorescent lamp which contains light components at many wavelengths spread across its spectrum. Moreover, in recent years, as it becomes increasingly common to use a plurality of fluorescent lamps together or to use fluorescent lamps with increasingly high outputs, more attention than ever has come to be paid to malfunctions of light-receiving modules ascribable to light components at particular wavelengths (for example, at 1,013 nm) within the spectrum of the light from a fluorescent lamp. For these reasons, light-receiving modules in practical use either have an interference filter arranged on top of a light-receiving device covered with a visible light shielding resin so as to receive signals cleared of unwanted light components having particular wavelengths within the spectrum of the light present, or have an interference filter embedded in a visible light shielding resin. This increases the number of components and the number of assembly steps required to fabricate light-receiving modules, and thus increases their costs and imposes restrictions on their sizes. All these problems can be overcome, and thus it is possible to realize inexpensive, ultra-compact light-receiving modules.

(2) In a case where an interference filter is embedded in a resin, it is difficult to achieve satisfactory reliability in terms of the accuracy with which the interference filter is fitted, exfoliation of the resin from the interference filter, and other factors. Such instability can be precluded. Moreover, it is possible to prevent generation of carriers at a junction (i.e., outside a depletion layer), and thereby suppress diffusing carriers, while leaving drifting carriers alone, so as to achieve fast response.

(3) The light-receiving device itself is given, on the top and side surfaces thereof, the function of electromagnetic shielding. When a metal conductive member is used as an electromagnetic shield, incident light is reflected by the metal conductive member, which thus reduces the effective light reception area (a loss of incident light). This can be overcome. Using a metal conductive member as an electromagnetic shield reduces the effective light reception area, and therefore the metal conductive member cannot be arranged over an unduly large area on the surface of the light-receiving device. This results in insufficient electromagnetic shielding. By contrast, in the embodiments described above, the surface of the light-receiving device serves, on its own, as a shielding layer, offering sufficient electromagnetic shielding. In a light-receiving module sealed in a resin, a mesh-like metal conductive member is formed on an internal light-receiving surface, and forming such a conductive member directly on the surface of a light-receiving device is equivalent to forming a parallel-plate capacitor there. This increases the capacitance of the device, and thus shortens the distance over which the light-receiving module incorporating it can receive signals. By contrast, in the embodiments described above, it is possible to prevent an increase in the capacitance of the device, and thereby avoid shortening the distance over which the light-receiving module incorporating it can receive signals. Since the light-receiving device itself is given the function of electromagnetic shielding, there is no need to provide a conductive film (metallized film) as conventionally fitted inside a light-receiving module against electromagnetic noise, or even a mesh-like structure as conventionally arranged in the light-receiving window of a module case. In this way, it is possible to eliminate separate components for electromagnetic shielding, and thus to realize a super-compact light-receiving module. In the embodiments described above, separate components for electromagnetic shielding may be used together, in which case it is possible to achieve a much greater electromagnetic shielding effect than with conventional structures, although there is a limit to miniaturization.

(4) Another advantage is that, as in the embodiment shown in FIGS. 6 and 7, by covering the layer 33 connected to one electrode 70 (the electrode from which a signal is extracted) with the other electrode 60 (the electrode connected to a predetermined potential), it is possible to make changes, as necessary, in the shapes of the electrodes and in the arrangement of the P-type and N-type layers of the device.

INDUSTRIAL APPLICABILITY

As described above, according to the present invention, it is possible to minimize the effects of noise and thereby prevent malfunctions. It is possible to reduce the number of components and the number of assembly steps. It is possible to prevent an increase in the capacitance of a device and thereby achieve fast response. It is possible to achieve miniaturization. In this way, the present invention is desirable in terms of performance, design, fabrication, and costs, and thus finds wide application in light-receiving devices and light-receiving modules such as infrared remote control devices.

The invention claimed is:

1. A light-receiving device comprising:
a substrate having a low-concentration impurity region;
a high-concentration impurity layer of a first conductivity type and a high-concentration impurity layer of a second conductivity type, one of which serves as an anode and the other serves as a cathode of the light-receiving device, each having a predetermined thickness, and formed at a light-entering side of the substrate and in contact with the low-concentration impurity region so as to function as a light-receiving portion; and
a layer having a short carrier life time, formed in contact with the low-concentration impurity region at a bottom surface of the substrate so as to restrict a depletion layer in the low-concentration impurity region of the substrate to a predetermined thickness and eliminate carriers generated within the layer quickly before the carriers produce a photoelectric current.

2. A light-receiving device as claimed in claim 1 wherein the layer having a short carrier life time is a high-concentration impurity layer of the first or second conductivity type.

3. A light-receiving device as claimed in claim 1 wherein the layer having a short carrier life time is a layer formed by adding to the substrate an impurity such as gold that forms a deep level.

4. A light-receiving device as claimed in claim 1 wherein one of the high-concentration impurity layers of the first and second conductivity types is shielded with an electrode that is kept at an identical potential with the other of the high-concentration impurity layers of the first and second conductivity types.

5. A light-receiving device comprising:
a substrate having a low impurity concentration;
a layer having a short carrier life time formed on a bottom surface of the substrate;
a high-concentration impurity layer of a first conductivity type formed on a top-surface side of the substrate so as to have a predetermined thickness;
a high-concentration impurity layer of a second conductivity type formed on the top-surface side of the substrate so as to surround the high-concentration impurity layer of the first conductivity type, the high-concentration impurity layers of the first and second conductivity types together functioning as a light-receiving portion;
an insulating layer formed on a top surface of the substrate; and
an electrode formed on the insulating layer and kept at an identical potential with the high-concentration impurity layer of the first conductivity type so as to shield the high-concentration layer of the second conductivity type.

6. A light-receiving device as claimed in claim 5, wherein the electrode is wider than the high-concentration impurity layer of the second conductivity type, and is formed parallel to the high-concentration impurity layer of the second conductivity type with the insulating layer sandwiched in between.

7. A light-receiving module comprising a lead frame, a light-receiving device fixed on the lead frame, and an insulating resin in which the lead frame and the light-receiving device are integrally sealed,
wherein the light-receiving device comprises: a substrate having a low impurity concentration; a layer having a short carrier life time formed on a bottom surface of the substrate; a high-concentration impurity layer of a first conductivity type formed on a top-surface side of the substrate so as to have a predetermined thickness; a high-concentration impurity layer of a second conductivity type formed on the top-surface side of the substrate so as to surround the high-concentration impurity layer of the first conductivity type, the high-concentration impurity layers of the first and second conductivity types together functioning as a light-receiving portion; an insulating layer formed on a top surface of the substrate; and an electrode formed on the insulating layer and kept: at an identical potential with the high-concentration impurity layer of the first conductivity type so as to shield the high-concentration layer of the second conductivity type,
and the layer having a short carrier life time is fixed on the lead frame with an insulating material.

8. A light-receiving module as claimed in claim 7, wherein the layer having a short carrier life time is connected to the lead frame.

9. A light-receiving module comprising a lead frame and a light-receiving device fixed on the lead frame,
wherein the light-receiving device comprises:
a substrate having a low impurity concentration;
a high-concentration impurity layer of a first conductivity type and a high-concentration impurity layer of a second conductivity type, each having a predetermined thickness and formed at a light entering side of the substrate so as to function as a light-receiving portion; and
a layer having a short carrier life time, formed in contact with a bottom surface of the substrate so as to restrict a thickness of the substrate and eliminate carriers generated within the layer quickly before the carriers produce a photoelectric current, and
wherein the layer having a short carrier life time is fixed on the lead frame with an insulating material.

* * * * *